United States Patent
Berger

(10) Patent No.: US 6,493,728 B1
(45) Date of Patent: Dec. 10, 2002

(54) DATA COMPRESSION FOR RECORDS OF MULTIDIMENSIONAL DATABASE

(75) Inventor: Alexander Berger, Redmond, WA (US)

(73) Assignee: Microsoft Corporation, Redmond, WA (US)

(*) Notice: Subject to any disclaimer, the term of this patent is extended or adjusted under 35 U.S.C. 154(b) by 180 days.

(21) Appl. No.: 09/602,615

(22) Filed: Jun. 22, 2000

Related U.S. Application Data

(60) Provisional application No. 60/140,432, filed on Jun. 22, 1999.

(51) Int. Cl.$^7$ ............................................... G06F 17/30
(52) U.S. Cl. ....................... 707/202; 707/203; 707/101
(58) Field of Search ................................. 707/202, 203, 707/101; 341/87

(56) References Cited

U.S. PATENT DOCUMENTS 5,652,879 A * 7/1997 Harris et al. ................ 707/101
5,873,097 A * 2/1999 Harris et al. ................ 707/203
6,054,943 A * 4/2000 Lawrence .................... 341/87

* cited by examiner

*Primary Examiner*—Diane D. Mizrahi
(74) *Attorney, Agent, or Firm*—Merchant & Gould P.C.; Timothy P. Sullivan

(57) ABSTRACT

Compressing measure data in cell data records in a database is disclosed. The systems and methods of the invention define an efficient mechanism to compress measure data in a multidimensional database. The measure data stored in integer format within the cell record is compressed. If the measure data is constant within a measure data field then no space is used to store the measure data other than the value of the measure data stored within a header. The format used lends itself well to random access, and also to creating aggregations of the cell data.

21 Claims, 9 Drawing Sheets

DATA COMPRESSION FOR RECORDS OF MULTIDIMENSIONAL DATABASE

RELATED APPLICATIONS

This application claims the benefit under 35 U.S.C. §119 (e) of U.S. Provisional Application, Ser. No. 60/140,432 filed on Jun. 22, 1999.

FIELD OF THE INVENTION

The present invention pertains generally to computer-implemented databases, and more particularly to compressing records in such databases.

BACKGROUND OF THE INVENTION

Online analytical processing (OLAP) is an integral part of most data warehouse and business analysis systems. OLAP services provide for fast analysis of multidimensional information. For this purpose, OLAP services provide for multidimensional access and navigation of the data in an intuitive and natural way, providing a global view of data that can be "drilled down" into particular data of interest. Speed and response time are important attributes of OLAP services that allow users to browse and analyze data online in an efficient manner. Further, OLAP services typically provide analytical tools to rank, aggregate, and calculate lead and lag indicators for the data under analysis.

In OLAP, information is viewed conceptually as cubes, consisting of dimensions, levels, and measures. In this context, a dimension is a structural attribute of a cube that is a list of members of a similar type in the user's perception of the data. Typically, there are hierarchy levels associated with each dimension. For example, a time dimension may have hierarchical levels consisting of days, weeks, months, and years, while a geography dimension may have levels of cities, states/provinces, and countries. Dimension members act as indices for identifying a particular cell or range of cells within a multidimensional array. Each cell contains a value, also referred to as a measure, or measurement.

One issue regarding the design of multidimensional databases is how to store the cell information in the multidimensional space. One potential design choice is to represent the multidimensional space as an array of cells, with the size of the array determined by the multiplication of the number of points in each dimension. A significant problem with this approach is that the size of the database grows exponentially as the number and size of the dimensions increase. This leads to a rapid depletion of the physical resources such as persistent storage and RAM required to implement the database. This phenomenon is known as data explosion for multidimensional databases.

Additionally, space is wasted in the above-mentioned approach, as data in multidimensional databases tends to be sparse. That is, not every cell is expected to have a value or measure associated with it. For example, consider a Store dimension having a hierarchy of Country, State, and City specifying the location of a store, and a Product dimension having a product identification and a product count measure. No store in the database will be expected to stock every possible product, and in fact any one store may only stock a small percentage of the available products. In this situation, most of the cells in the multidimensional space would contain no data, thus wasting much of the space allocated to the database.

Another issue relates to the capability to perform aggregations on the multidimensional data. Databases are commonly queried for aggregations (e.g. summaries, minimums, maximums, counts, etc.) of detail data rather than individual data items. For example, a user might want to know sales data for a given period of time without regard to geographical distinctions. These types of queries are efficiently answered through aggregations. Aggregations are precomputed summaries of selected detail data that allow an OLAP system or a relational database to respond quickly to queries by avoiding collecting and aggregating detailed data during query execution. Without aggregations, the system needs to scan all of the rows containing the detailed data to answer these queries, resulting in potentially substantial processing delays. With aggregations, the system computes and materializes aggregations ahead of time so that when the query is submitted to the system, the appropriate summary already exists and can be sent to the user much more quickly. Calculating these aggregations, however, can be costly, both in terms of processing time and in terms of disk space consumed.

SUMMARY OF THE INVENTION

The present invention is directed at addressing the above-mentioned shortcomings, disadvantages and problems, and will be understood by reading and studying the following specification.

The systems, methods, and apparatus described herein create and maintain cell data records in an OLAP database system. The measure data fields located within cell data records are loaded from a data store and a determination is made as to whether to compress the measure data fields. One aspect of the system loads the measure data in segments, and all subsequent processing of the measure data is performed on a segment by segment basis. If the measure data are to be compressed, a size of a space to store the measure data in a compressed format is determined. The size determination may be made utilizing many different operations. The size may be determined based on the range of values contained within the measure data fields. Additionally, the size may be determined based on the minimum/maximum values of the measure data. Another aspect of the system determines if the values within the measure data field are constant. In other words, if the measures within the measure data field are all the same then the values are constant. If the values are constant then the value of the measure data is stored within a header and the measure data are not compressed or stored on a data store. If the values are not constant, the determined size of a space is stored in a header that can be accessed at a later time. The measure data is then compressed and stored in a data store in binary format. Storing the measure data in a fixed field size allows the data to be randomly accessed. Additionally, the compression operation provides an efficient mechanism for creating aggregations.

The present invention describes systems, clients, servers, methods, and computer-readable media of varying scope. In addition to the aspects and advantages of the present invention described in this summary, further aspects and advantages of the invention will become apparent by reference to the drawings and by reading the detailed description that follows.

DETAILED DESCRIPTION OF THE PREFERRED EMBODIMENT

In the following detailed description of exemplary embodiments of the invention, reference is made to the accompanying drawings, which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

The detailed description is divided into four sections. In the first section, a system level overview of an exemplary embodiment of the invention is presented. In the second section, the hardware and the operating environment in conjunction with which embodiments of the invention may be practiced are described. In the third section, an exemplary cube for an OLAP system is described. In the fourth section, methods of an exemplary embodiment of the invention are provided.

System Level Overview

Figure 5:
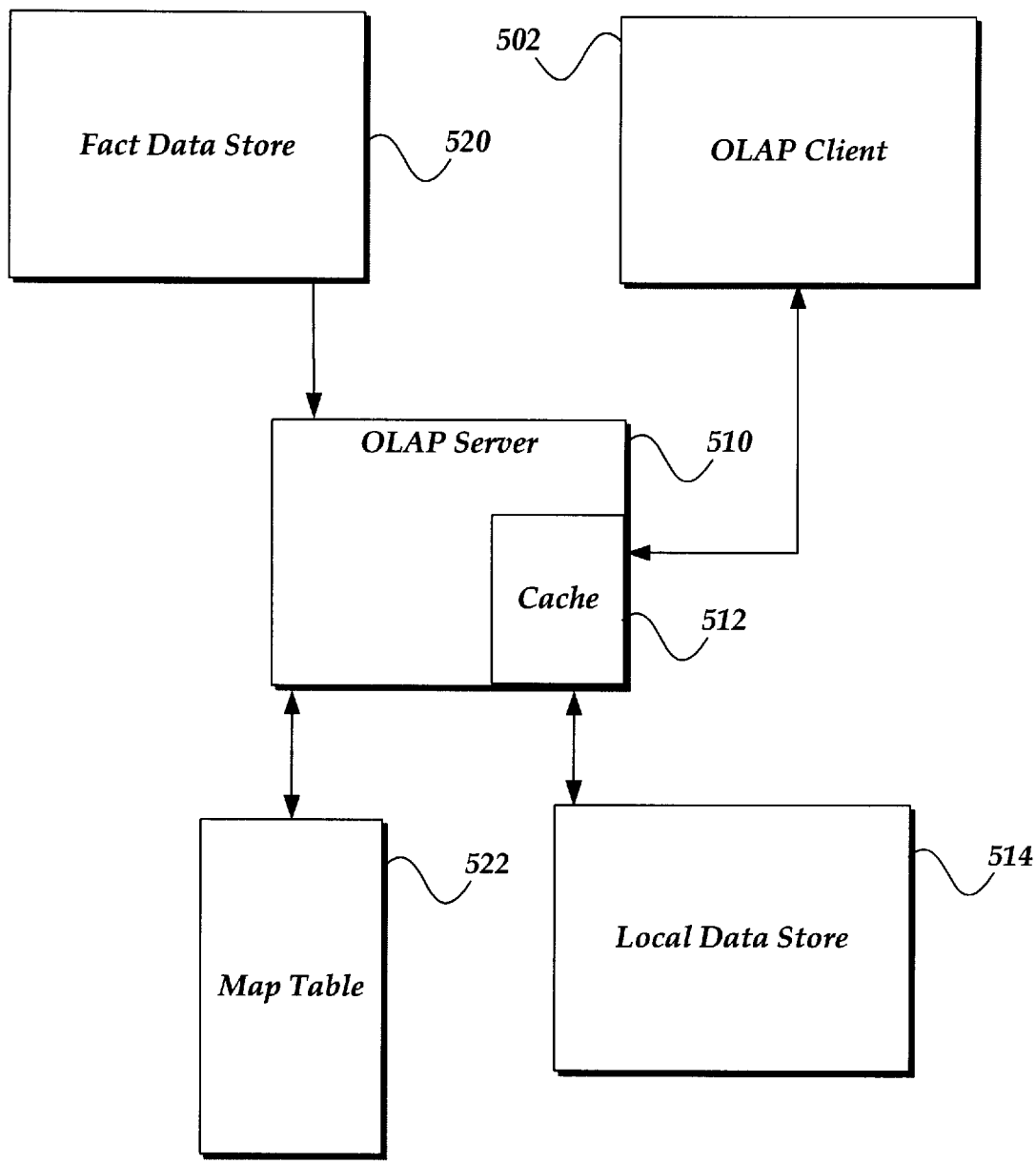
FIG. 5 is a system level overview of various embodiments of the invention.

A system level overview of the operation of an exemplary embodiment of the invention is described by reference to FIG. 5. The concepts of the invention are described as operating in a multiprocessing, multithreaded virtual memory operating environment on a computer, such as computer 20 in FIG. 1. The operating environment includes an OLAP client 502, OLAP server 510, local data store 514, and fact data store 520, all of which operate on the cell records for cubes, including the records and cube described in the previous section.

OLAP client 502 is an application program that requires the services of an OLAP system. OLAP client 502 may be any type of application that interacts with the OLAP system, for example, a data mining application, a data warehousing application, a reporting application, etc. OLAP client 502 typically interacts with OLAP server 510 by issuing OLAP queries. These queries are parsed, as is known in the art, into a request for data from a cell or range of cells, and the request is passed to the OLAP server 510.

OLAP server 510 receives queries and controls the processing of queries. In one embodiment of the invention, the server maintains a local store 514 that contains the cell data used to answer the queries. In an embodiment of the invention, the OLAP server 510 is a version of the SQL Server OLAP product from Microsoft Corporation.

The local data store 514 contains records describing the cells that are present in a multidimensional database, with one record used for each cell that actually has measurement data present (i.e. no records exist for those cells having no measurement data). The general format of these records is described above with reference to FIG. 4. In an embodiment of the invention, local data store 514 is a relational database, such as SQL Server. In this particular embodiment, records are stored in a relational table. This table can be indexed based on the dimensional paths of the record to allow rapid access to cell measurement data contained in the record. The indexing can be performed using hash indexing or AVL tree indexing as is known in the art.

OLAP server 510 populates local data store 514 by reading data from fact data store 520. Fact data store 520 is also a relational database system. In one embodiment of the invention, the system used is the SQL Server Database from Microsoft Corporation. In alternative embodiments of the invention, database systems such as Oracle, Informix or Sybase can be used. The invention is not limited to any particular type of relational database system.

OLAP server 510 reads the fact data (also known as detail data) from fact data store 520 at predetermined times, and converts the fact data into cell data records for populating local data store 514. In an embodiment of the invention, the fact data is read once during a 24 hour period, typically during a time when the fact data store is not busy responding to user queries. In an alternative embodiment of the invention, the fact data is read and converted when a system administrator issues a command to the OLAP server 510 to do so. Updates to the local data store 514 can be incremental, or they can result in a complete refresh of the data. Incremental updates are desirable, because only the data that has changed in fact data store 520 need be converted and added to local data store 514. However, if the structure of the data in either fact data store 520 or local data store 514 changes, then a complete refresh is required. The frequency of updates to the local data store 514 will generally be determined by user requirements as to how current (or accurate) the cell data must be, and the volume of data that must be updated.

OLAP server 510 also maintains a map table 522. The map table 522 is used to maintain mappings from rigid dimensional paths to unique member identifiers. The OLAP server 510 uses the map table to determine whether or not a flexible path can be constructed when a new cell record is added to local data store 514.

In an embodiment of the invention, the OLAP server 510 maintains a cache 512 of cell records. In this embodiment, the cache 512 maintains cell data records that have been recently requested, or those cell data records that are frequently requested. Maintaining cell record data in a cache is desirable, because it provides quicker responses to queries that can be satisfied by records appearing in the cache.

Hardware and Operating Environment

Figure 1:
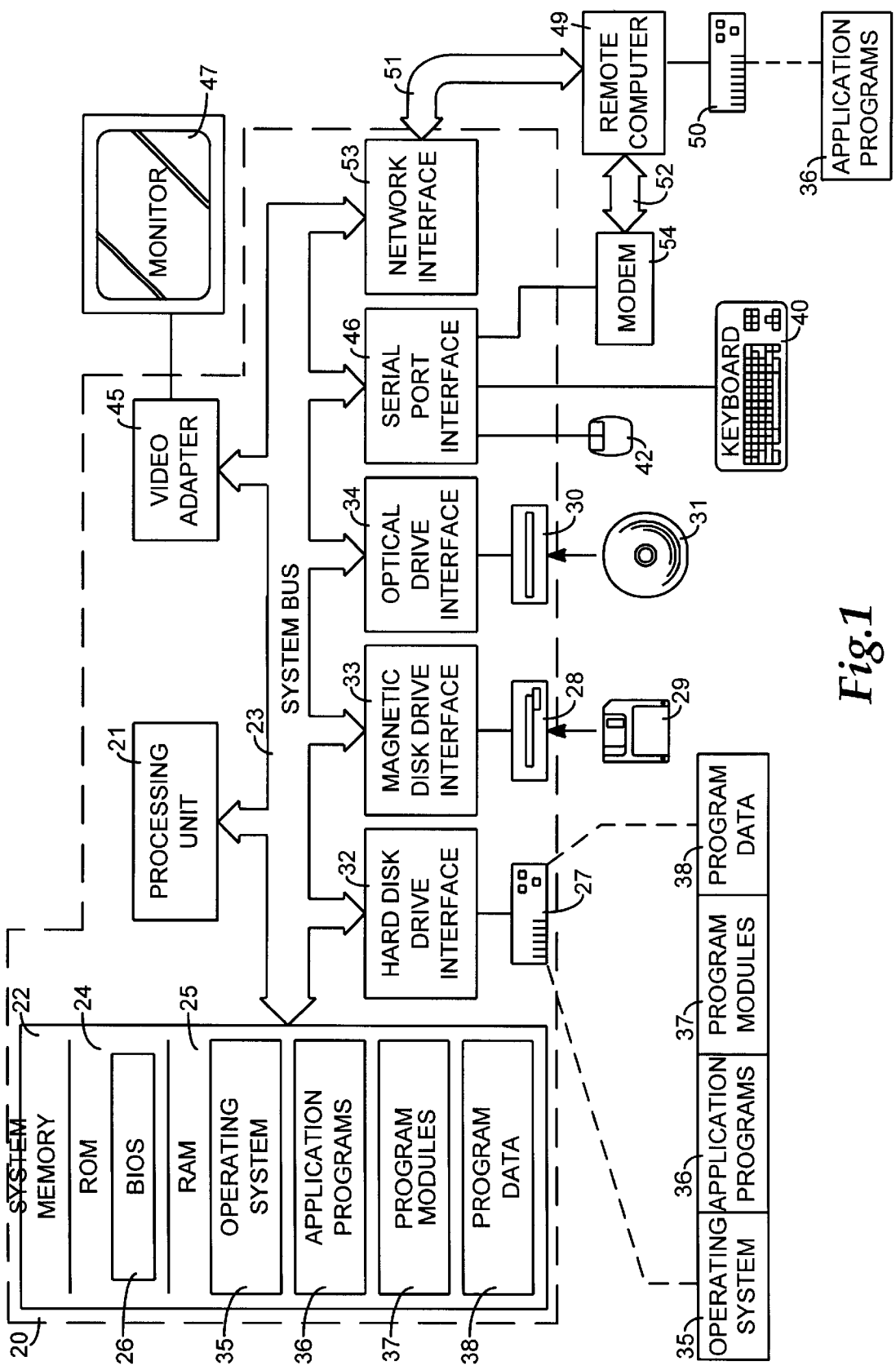
FIG. 1 is a diagram illustrating a hardware and operating environment in conjunction with which embodiments of the invention may be practiced.

FIG. 1 is a diagram of the hardware and operating environment in conjunction with which embodiments of the invention may be practiced. The description of FIG. 1 is intended to provide a brief, general description of suitable computer hardware and a suitable computing environment in conjunction with which the invention may be implemented. Although not required, the invention is described in the general context of computer-executable instructions, such as program modules, being executed by a computer, such as a personal computer. Generally, program modules include routines, programs, objects, components, data structures, etc., that perform particular tasks or implement particular abstract data types.

Moreover, those skilled in the art will appreciate that the invention may be practiced with other computer system configurations, including hand-held devices, multiprocessor systems, microprocessor-based or programmable consumer electronics, network PCS, minicomputers, mainframe computers, and the like. The invention may also be practiced in distributed computing environments where tasks are performed by remote processing devices that are linked through a communications network. In a distributed computing environment, program modules may be located in both local and remote memory storage devices.

The exemplary hardware and operating environment of FIG. 1 for implementing the invention includes a general purpose computing device in the form of a computer 20, including a processing unit 21, a system memory 22, and a system bus 23 that operatively couples various system components including the system memory to the processing unit 21. There may be only one or there may be more than one processing unit 21, such that the processor of computer 20 comprises a single central-processing unit (CPU), or a plurality of processing units, commonly referred to as a parallel processing environment. The computer 20 may be a conventional computer, a distributed computer, or any other type of computer; the invention is not so limited.

The system bus 23 may be any of several types of bus structures including a memory bus or memory controller, a peripheral bus, and a local bus using any of a variety of bus architectures. The system memory may also be referred to as simply the memory, and includes read only memory (ROM) 24 and random access memory (RAM) 25. A basic input/output system (BIOS) 26, containing the basic routines that help to transfer information between elements within the computer 20, such as during start-up, is stored in ROM 24. The computer 20 further includes a hard disk drive 27 for reading from and writing to a hard disk, not shown, a magnetic disk drive 28 for reading from or writing to a removable magnetic disk 29, and an optical disk drive 30 for reading from or writing to a removable optical disk 31 such as a CD ROM or other optical media.

The hard disk drive 27, magnetic disk drive 28, and optical disk drive 30 are connected to the system bus 23 by a hard disk drive interface 32, a magnetic disk drive interface 33, and an optical disk drive interface 34, respectively. The drives and their associated computer-readable media provide nonvolatile storage of computer-readable instructions, data structures, program modules and other data for the computer 20. It should be appreciated by those skilled in the art that any type of computer-readable media which can store data that is accessible by a computer, such as magnetic cassettes, flash memory cards, digital video disks, Bernoulli cartridges, random access memories (RAMs), read only memories (ROMs), and the like, may be used in the exemplary operating environment.

A number of program modules may be stored on the hard disk, magnetic disk 29, optical disk 31, ROM 24, or RAM 25, including an operating system 35, one or more application programs 36, other program modules 37, and program data 38. A user may enter commands and information into the personal computer 20 through input devices such as a keyboard 40 and pointing device 42. Other input devices (not shown) may include a microphone, joystick, game pad, satellite dish, scanner, or the like. These and other input devices are often connected to the processing unit 21 through a serial port interface 46 that is coupled to the system bus, but may be connected by other interfaces, such as a parallel port, game port, or a universal serial bus (USB). A monitor 47 or other type of display device is also connected to the system bus 23 via an interface, such as a video adapter 48. In addition to the monitor, computers typically include other peripheral output devices (not shown), such as speakers and printers.

The computer 20 may operate in a networked environment using logical connections to one or more remote computers, such as remote computer 49. These logical connections are achieved by a communication device coupled to or a part of the computer 20; the invention is not limited to a particular type of communications device. The remote computer 49 may be another computer, a server, a router, a network PC, a client, a peer device or other common network node, and typically includes many or all of the elements described above relative to the computer 20, although only a memory storage device 50 has been illustrated in FIG. 1. The logical connections depicted in FIG. 1 include a local-area network (LAN) 51 and a wide-area network (WAN) 52. Such networking environments are commonplace in offices, enterprise-wide computer networks, intranets and the Internet.

When used in a LAN-networking environment, the computer 20 is connected to the local network 51 through a network interface or adapter 53, which is one type of communications device. When used in a WAN-networking environment, the computer 20 typically includes a modem 54, a type of communications device, or any other type of communications device for establishing communications over the wide area network 52, such as the Internet. The modem 54, which may be internal or external, is connected to the system bus 23 via the serial port interface 46. In a networked environment, program modules depicted relative to the personal computer 20, or portions thereof, may be stored in the remote memory storage device. It is appreciated that the network connections shown are exemplary and other means of and communications devices for establishing a communications link between the computers may be used.

The hardware and operating environment in conjunction with which embodiments of the invention may be practiced has been described. The computer in conjunction with which embodiments of the invention may be practiced may be a conventional computer, a distributed computer, or any other type of computer; the invention is not so limited. Such a computer typically includes one or more processing units as its processor, and a computer-readable medium such as a memory. The computer may also include a communications device such as a network adapter or a modem, so that it is able to communicatively couple other computers.

Exemplary Cube and Dimension

Figure 2:
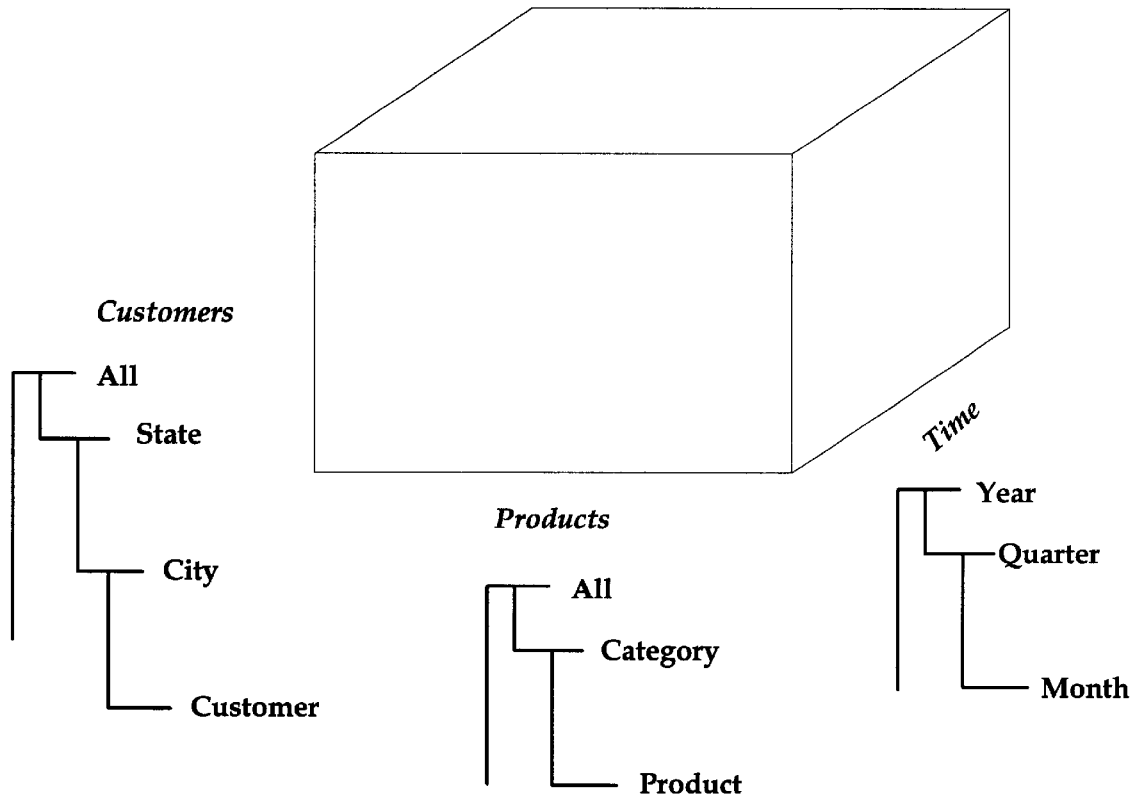
FIG. 2 is a diagram illustrating an exemplary OLAP cube having three dimensions.

In the detailed description that follows, reference will be made to a small, three-dimensional OLAP cube as shown in FIG. 2. This exemplary OLAP cube has three dimensions. The first dimension, the Customers dimension, has four hierarchical levels (All, State, City, and Customer). The second dimension, the Products dimension, has three levels (All, Category and Product). Finally, the third dimension, the Time dimension has three levels (Year, Quarter, and Month). Additionally, the cube has two measures, Purchases and Units (not shown). This cube is presented to provide a reference example of how the systems and methods of the invention operate. It will be appreciated that the OLAP cubes maintained by various embodiments of the invention may have more or fewer dimensions than in this example, and that the OLAP cube may have more or fewer hierarchy levels than in this exemplary example.

Figure 3A:
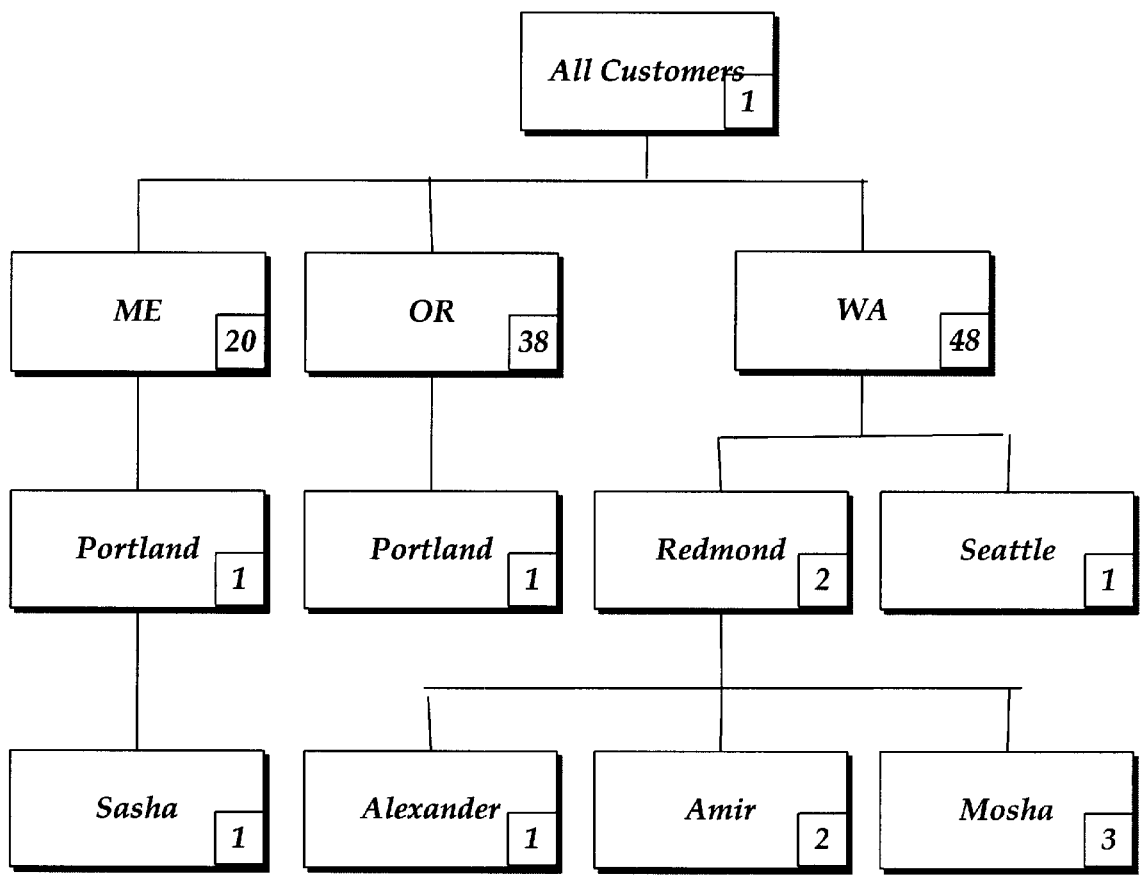
FIGS. 3A–3C are diagrams illustrating an exemplary dimension hierarchy within a multidimensional database.
Figure 3B:
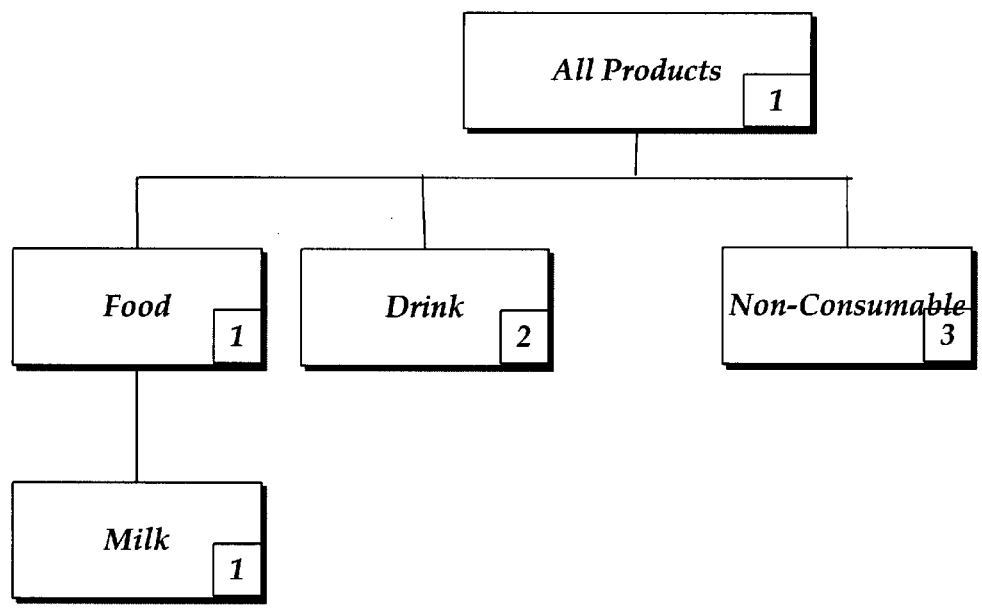
Figure 3C:
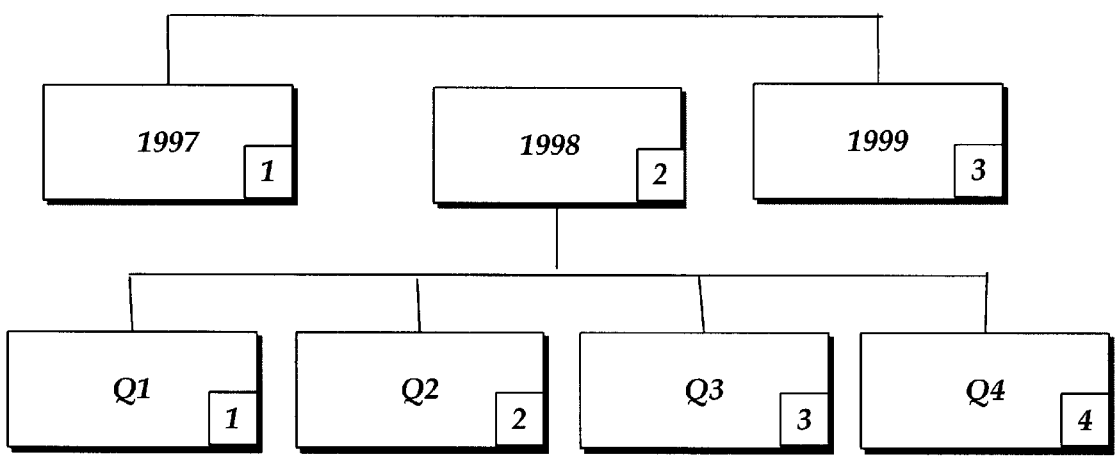

Graphical representations of the dimensions in the above-described exemplary cube are presented in FIGS. 3A–3C. A dimension is represented as a tree, referred to as a dimension tree. Leaf nodes in the tree correspond to the most detailed data in the dimension, while the inner branch nodes correspond to more aggregated data. The closer the node is to the root node, the more aggregated the data, with the root node representing the most aggregated, least detailed data in the dimension.

The Customer dimension is represented in FIG. 3A. In this exemplary representation, the State level has three members: Maine (ME), Oregon (OR) and Washington (WA). The Cities level has four members: Portland (ME), Portland (OR), Redmond and Seattle. It should be noted although a member labeled Portland appears twice, each member is a distinct reference because it appears under a different State member in the hierarchy. The Customer level has four members: Sasha, Alexander, Amir, and Mosha.

The Products dimension is represented in FIG. 3B. In the exemplary representation, the Category level has three members: Food, Drink, and Non-Consumable. The Product level has one member, Milk.

The Time dimension is represented in FIG. 3C. In the exemplary representation, the Year level has three members: 1997, 1998, and 1999. The Quarter level has four members: Q1–Q4. The Month level has no members, indicating that no monthly data is available. In this case, the most detailed data available is at the Quarter level.

Each data cell in a multidimensional database is uniquely identified by specifying a coordinate on each dimension. In one embodiment of the invention, a cell is identified by specifying a dimension path for each dimension in a cube in the multidimensional database. The collection of dimension paths comprising the coordinates for the cell are concatenated and stored in an array referred to as the system path. In an embodiment of the invention, the order of dimension paths in the system path is dependent on the internal order of the dimensions in the cube, as determined by the metadata defining the cube. However, the invention is not limited to a particular ordering scheme and other ordering schemes are possible and within the scope of the invention. For example, the order of dimension paths could be determined alphabetically by the name of the dimension.

In order to uniquely identify a particular member, each of the members from the root node to the leaf node for the member is specified. For example, in an embodiment of the invention, in order to refer to the customer Amir in the Customers dimension shown in FIG. 3A the following sequence of members is specified: {All Customers}. {WA}. {Redmond}. {Amir}. Similarly, to refer to Quarter 2 in the Time dimension shown in FIG. 3C, the members specified are: {1998}. {Q2}.

Those of ordinary skill in the art will appreciate that the members shown in FIGS. 3A–3C represent an exemplary cube and that no embodiment of the invention is limited to a particular number or type of dimensions or dimension members.

In the above example, strings representing member names are used to designate a particular member of a dimension. Alternatively, the strings are replaced with representative members numbers. When represented by numbers, a path from the root node to a branch node is represented by a member number at each level of the dimension that is traversed to reach the leaf node. The number assigned to each member is unique among the members having a common parent. In other words, a unique number is assigned to each of the siblings of a parent. In one embodiment, the root node is assigned the number 1 while branch and leaf nodes are assigned a number representing their order among their siblings. The invention, however, is not limited to any particular numbering scheme for the node. It is sufficient that the number is unique among the nodes having a common parent.

Thus, each member in a dimension is represented by an array of numbers defining the path to the member. This array is the dimension path. The number of elements in the array is the number of levels in the dimension, and the position in the array reflects the hierarchy of levels. For example, referring to FIG. 3A, the dimension path for member Amir in the Customers dimension is {1-48-2-2}. This represents the path comprising the root node All Customers (1), the WA member at the state level (WA is the $48^{th}$ state alphabetically), the Redmond member at the city level (Redmond is the second city at that level under WA), and the member Amir at the customer level (Amir is the second customer under Redmond). In one embodiment, a number in the array represents each level. If the member is not at a leaf node, the number 0 is used in one embodiment of the invention to represent the positions for the levels below the member. Thus, the dimension path array for the member Portland, OR in the Customer dimension is {1-38-1-0}.

Not all dimensions have a single root member. For example, consider the Time dimension of the exemplary cube. There is no single "all time" member at the top-most level in this dimension, rather the Time dimension contains three members, each specifying a particular year. In this case, one embodiment of the invention assigns an index number to each members in the top-most level based on a natural order of the members. This natural order can be based on a numeric order, an alphabetic order, or the temporal order in which the members were created. For instance, in FIG. 3C, the dimension path for Q3 in the year 1998 is {2-3-0} (1998 is the second year at the top-most level, Q3 is the third member under 1998, and there are no month members).

The dimension paths described above are referred to as rigid dimension paths, because they do not allow a cell to change its position within the dimension hierarchy without having to rebuild the database. This is because the indexing scheme used directly maps to a particular point in the hierarchy, and cannot map to any other point without changing at least one of the index components.

Flexible dimension paths offer an alternative to rigid dimension paths. Flexible dimension paths allow a cell to change its position in the hierarchy without affecting the stored path. In order to implement flexible paths, a system maintains a mapping from a rigid dimensional path to an identifier associated with a cell member. For example, the table below illustrates a mapping for the Customer dimension members provided above.

TABLE 1

| Customer | Id | Rigid Dimension Path |
|---|---|---|
| Alexander | &14 | {1-48-2-1} |
| Amir | &15 | {1-48-2-2} |

TABLE 1-continued

| Customer | Id | Rigid Dimension Path |
|---|---|---|
| Mosha | &16 | {1-48-2-3} |
| Sasha | &17 | {1-20-1-1} |

To illustrate the system path described above, consider the cell associated with the customer Amir for All Products in Quarter 4 of 1998. The string representation for the cell path is: ({Customers}. {All_Customers}. {WA}. {Redmond}. {Amir}, {Products}. {All Products}, {Time}. {1998}. {Q4 }). The corresponding system path using numbered rigid dimensional paths is: {1-48-2-2}-{1-0-0}-{2-4-0}. The same system path can be represented using a flexible dimension path as {& 15 }-{1-0-0}-{2-4-0}. In this case, when the cell is accessed, the accessor consults a mapping table to determine the correct cell location for the dimension represented by the flexible portion of the path. In the example above, only one dimension has a flexible path. The invention is not so limited, however, and the number of flexible paths appearing in a system path is not fixed to any particular number. It is desirable to differentiate the flexible path from a rigid path containing only one level, thus a flexible path is introduced by a distinguishing character. In one embodiment of the invention, the distinguishing character is the "&", however the invention is not limited to any particular distinguishing character or set of characters. Now assume that Amir moves from Redmond to Seattle. In this case, the rigid dimensional path changes from {1-48-2-2} to {1-48-1-1}. However, the flexible dimension path remains the same (& 15). Thus, as can be seen from the above example, the database does not need to be rebuilt when a member moves from one point in the hierarchy to another, because the system path to the cell does not change. The change is to the mapping in a map table, not the path in a local store.

In another embodiment of the invention, the numbered rigid dimensional path and flexible dimension path are compressed. In one particular embodiment, each member number in the system path is represented by the least number of bits to store the largest member number at that particular level.

In addition to a system path, each cell in a multidimensional database has one or more measures associated with it. In the exemplary cube, two measures are defined, Purchases and Units, where Purchases is the dollar amount of a particular purchase, and Units is the number of units purchased. In one embodiment of the invention the integer data in the measures is compressed in binary format. The data are compressed in such a way as to maintain random access to the data, thereby decreasing access time to the data.

Figure 4:
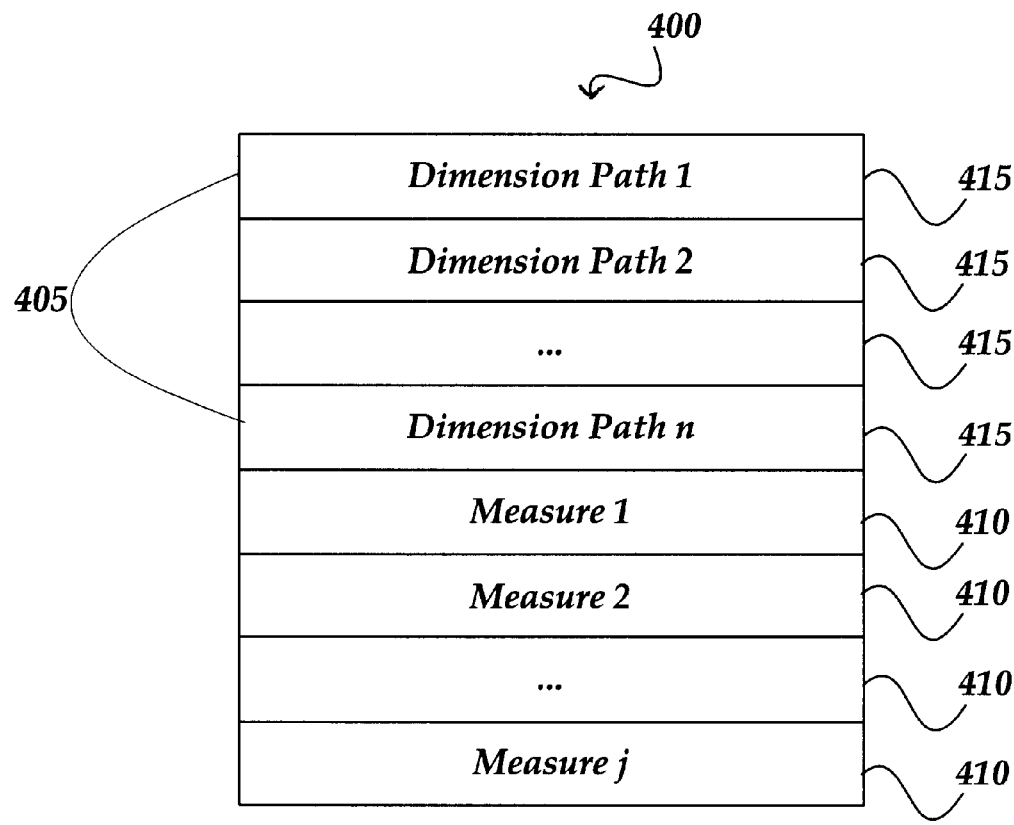
FIG. 4 is a diagram illustrating a record structure for a cell data record according to an embodiment of the invention.

FIG. 4 illustrates a data structure for a cell record 400 according to one embodiment of the invention. Cell record 400 contains a system path 405 and one or more compressed measures 410. As described above, system path 405 comprises one or more dimension paths 415. The dimension paths can be either flexible dimension paths or rigid dimension paths, compressed or uncompressed. The order of measures 410 in record 400 may be determined by the order of the measures in the metadata defining the cube, the temporal order in which the measure were defined, or an alphabetic order. The invention is not limited to any particular ordering mechanism.

This section of the detailed description has described a representation of cells in a multidimensional database, and a data structure for storing a cell record. In the sections that follow, systems and methods for creating and manipulating the cell data will be described.

METHODS OF AN EXEMPLARY EMBODIMENT OF THE INVENTION

Figure 7:
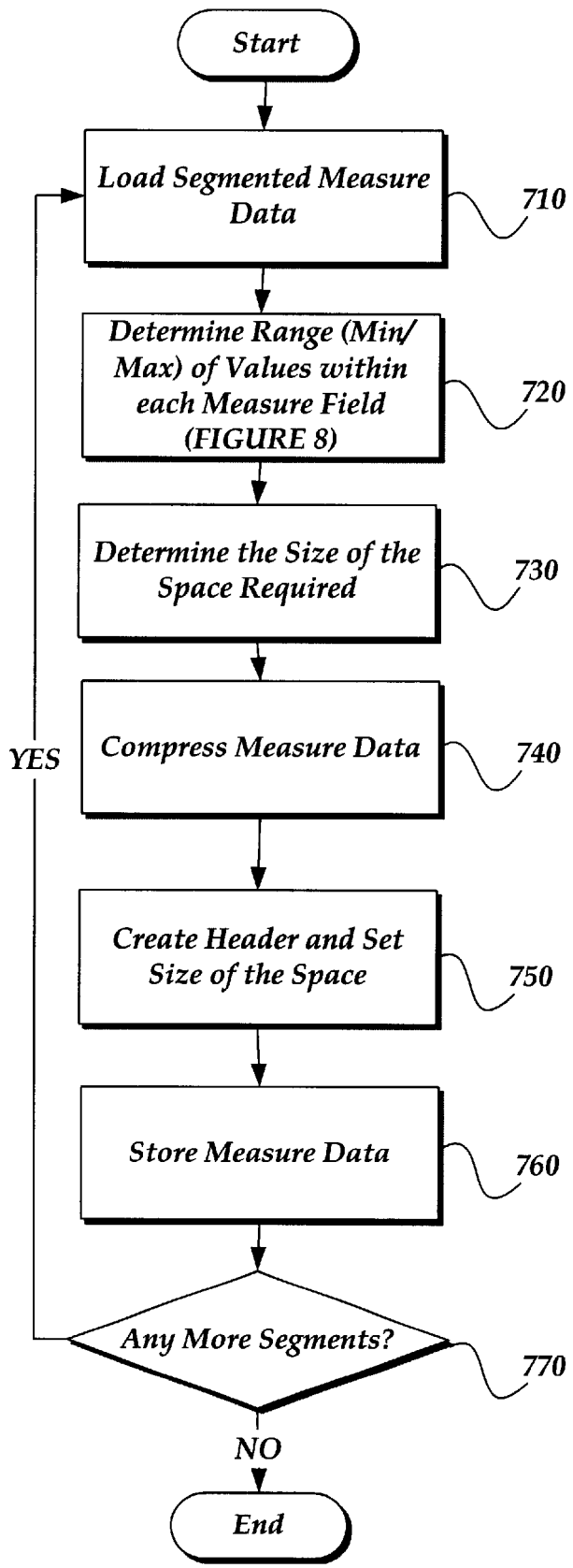
FIG. 7 is a flowchart illustrating compressing measure data in an embodiment of the invention.
Figure 8:
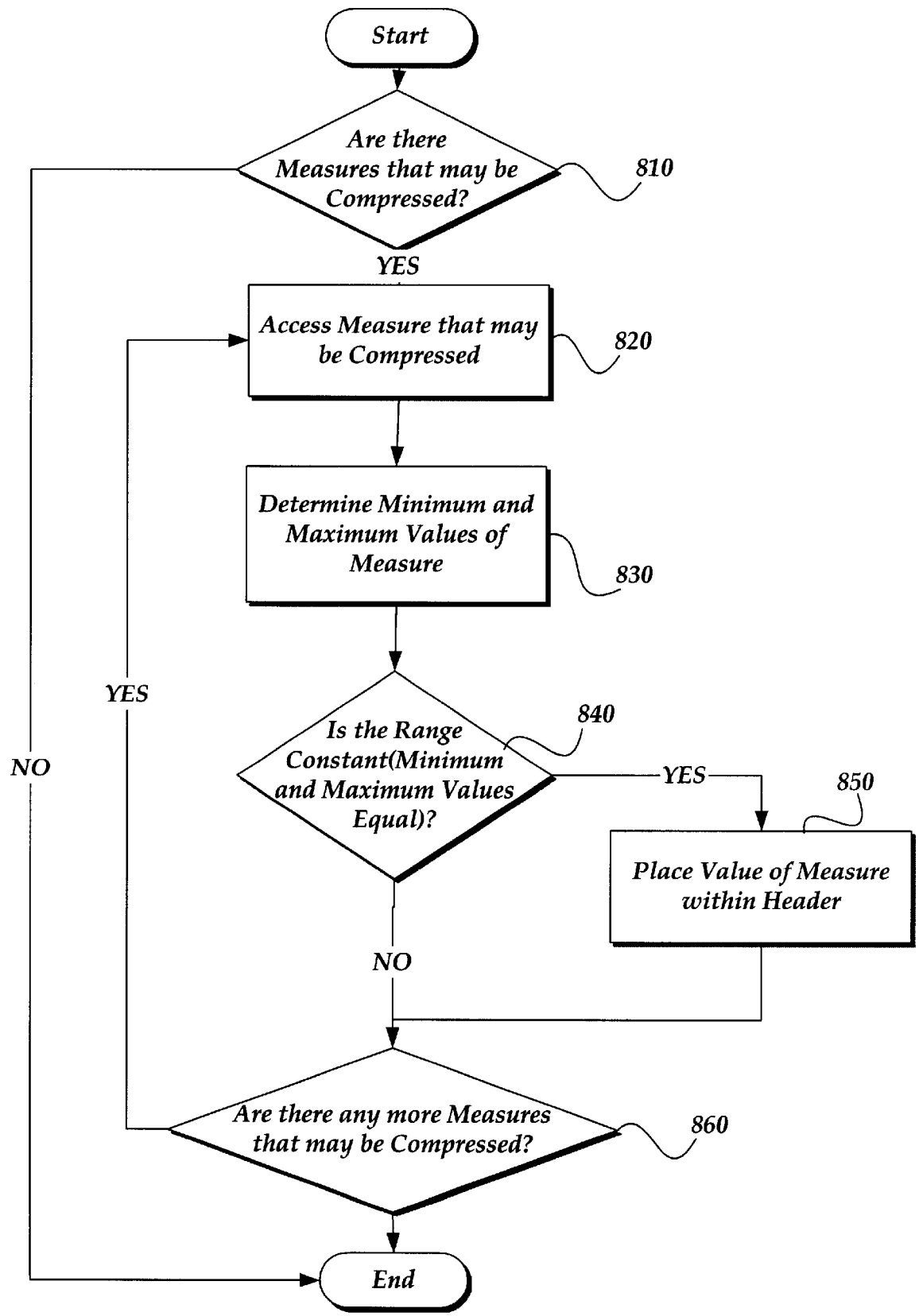
FIG. 8 is a flowchart illustrating determining the range of values within the measure data in an embodiment of the invention.

In a previous section, a system level overview of the operation of an exemplary embodiment of the invention was described. In this section, the particular operations of the invention performed by an operating environment executing an exemplary embodiment are described by reference to a series of flowcharts shown in FIGS. 6–8. The operations to be performed by the operating environment constitute computer programs made up of program modules and computer-executable instructions, or logic circuits and/or hardwired logic modules. Describing the operations by reference to a flowchart enables one skilled in the art to develop such programs including such instructions to carry out the operations on suitable computers (the processor of the computer executing the instructions from computer-readable media). The operations illustrated in FIGS. 6–8 are inclusive of the acts to be taken by an operating environment executing an exemplary embodiment of the invention.

Figure 6:
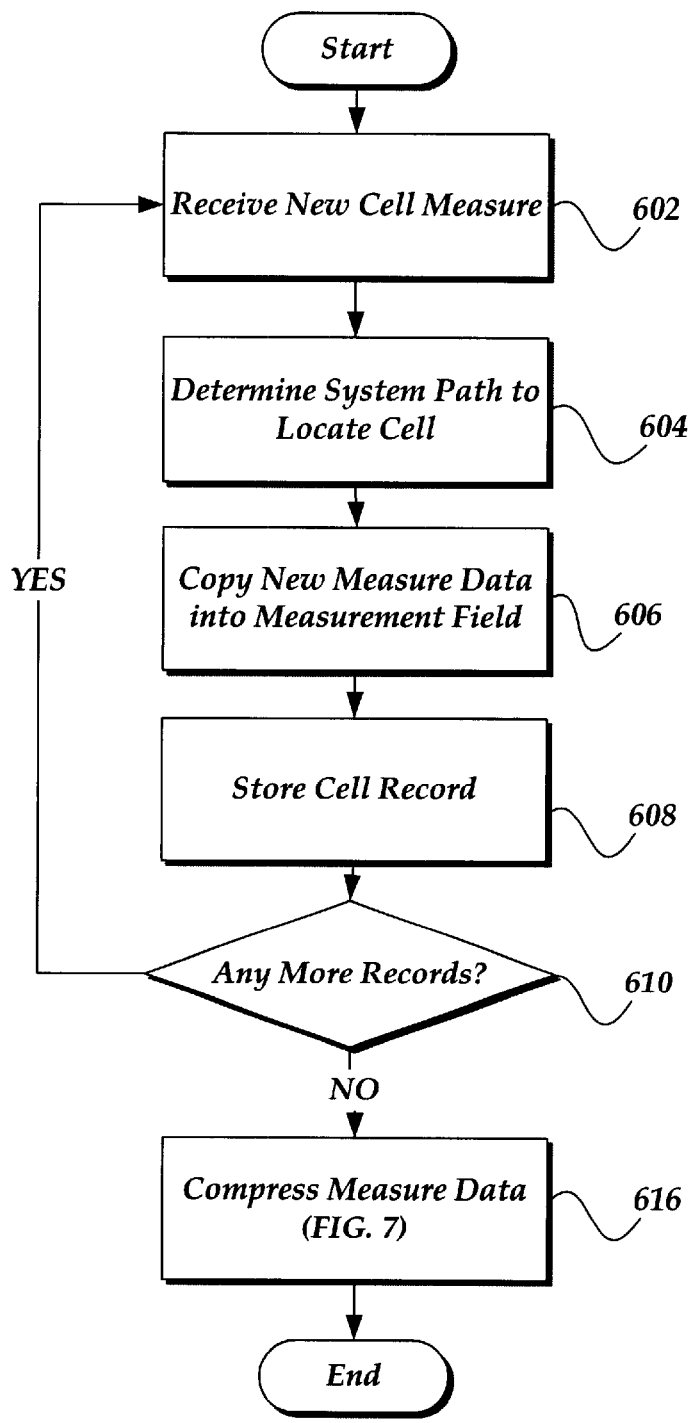
FIG. 6 is a flowchart illustrating a process for creating cell records having compressing measure data in an embodiment of the invention.

An operational flow for creating cell records having compressed measure data is illustrated in FIG. 6. The operational flow begins when a program executing the method, such as OLAP server 510, discovers that a new cell is required. Receive operation 602 receives a value to be used for the measure of the new cell. Typically the new cell will be required because OLAP Server 510 has discovered that a new row has been added to a detail table in a fact data store 520 (FIG. 5) since the last update of the local data store 514.

Next, the locate module 604 determines the system path to locate the cell. As discussed above, cells are located by specifying members in each dimension of the OLAP cube. The members reside at a particular level of a dimension tree formed by the levels of the dimension and the members at each level. In an embodiment of the invention, the dimension path is an array of ordinal numbers, one for each level in the dimension. The position of each ordinal number in the array is determined by the position of the level in the dimension hierarchy. The ordinal number at a position is determined by an ordering of the members at the particular level that have a common parent. In one embodiment of the invention, if the new cell is not a leaf node, then a value of 0 is used in the dimension path to represent each of the levels below the new cell.

Copy operation 606 copies the measure data into an appropriate field in the cell record. The cell record contains a measure field for each measure present in the cube. The ordering of measures within a record is also determined by the metadata defining the cube.

Record operation 608 then stores the cell record in a data store. In one embodiment of the invention, the cell record is stored in the local data store as a row of a relational database. The row can be indexed by the system path, allowing subsequent queries requiring the cell's measures to find the cell quickly. As will be appreciated by those of ordinary skill in the art, the cell record may be stored many different ways. For example, the cell record can be stored in the RAM 25 of the computer 20. Decision block 610 determines if there are any more records to be processed, and if so, returns to block 602. Otherwise, the measure data for the records are compressed in compression operation 616 (FIG. 7).

FIG. 7 illustrates an operation flow for compressing the cell measure data for the cell records created in FIG. 6. In an embodiment of the invention, load operation 710 loads the cell measure data in sizes of 64K segments. As will be appreciated by those of ordinary skill in the art, other segment sizes may be used. For example, the segment sizes may be 16K, 32K, or 256K. In another embodiment, the cell data are not loaded in segments. Rather, the entire set of measure data for the OLAP cube is processed by the system. Next, for each measure field in the cell record stored in integer format, range operation 720 determines the range of values within the measure data (See discussion for FIG. 8). In one embodiment of the invention, the minimum value and maximum value is determined for each measure data field. Size module 730 determines the size of the space to store the values in a compressed format. In one embodiment of the invention, the size of the space to store the measure data values is the number of bits required to represent the maximum value found within the measure data for each measure data field of the loaded segment. For example, in the exemplary cube described above (FIG.2 and FIGS. 3A–3C), if the measure data contained a column of data in which the largest value was 1000, then 10 bits would be used to store all of the integer values within that measure field. In another embodiment of the invention, the size of the space to store the measure data values is based on the difference between the maximum value and minimum value within the measure data. The number of bits required to store the difference value is determined and used as the size of the space to store the measure data values. As will be appreciated by those of ordinary skill in the art, other compression methods may be utilized.

After the size of the space is determined for the measure fields, compression operation 740 compresses the measure data for each measure field that is to be compressed. In one embodiment of the invention, each value within each measure field of the segment is converted to binary format and stored in accordance with the size of the space as determined in size module 730. In one embodiment of the invention, the size of the space is the number of bits to store the maximum value of the measure data field in binary format. For example, if the values within a measure field are 0, 1, and 2, the data would be stored in 2 bits as 2 bits are required to store the value 2 in binary format. In this particular example, the values for the measure field would be represented by the bits 00, 01, and 10, respectively. In another embodiment of the invention, the size of the space is the number of bits to store the difference between the maximum value and minimum value of the measure data field in binary format. Next, header operation 750 creates a header to store the size of the determined space to store the measure data of the field. In one embodiment of the invention, the size is the number of bits used to store the compressed measure data of the field. In the example above, the value 2 would be stored in the header indicating that 2 bits are used to store the measure data field. In another embodiment of the invention, the minimum value of the measure data is also stored in the header. If the minimum value is stored the value is used as an offset value for the measure data. In one embodiment of the invention, the header is stored in RAM 25 of the computer 20. In another embodiment, the header is stored in the cache 512, local data store 514, fact data store, or OLAP client. This header is then used by the system to determine which bits store a particular level. The compressed measure data are then stored by a data store 760. In one embodiment of the invention, the compressed data measures are stored in the local data store. Decision operation 770 determines if there are any more segments, and if so, returns to load operation 710. If not, the process returns.

FIG. 8 illustrates an operation flow for determining the range of values within each measure field column stored in integer format. Initially, test operation 810 detects whether there are any measure fields that may be compressed. In one embodiment of the invention the measure data may be compressed if the measure data are stored in integer format. If there is a measure field that may be compressed, access operation 820 accesses the measure field that may be compressed within the loaded segment. Next, min/max operation 830 determines the minimum and maximum values of the measure data contained within the field creating a range of values. In one embodiment of the invention, the minimum and maximum values are determined by the minimum and maximum value within the segment. In another embodiment of the invention, the index range, or the minimum and maximum values, is the range of potential values for a particular measure. For example, if the measure were States, and the States were represented numerically (1–50), then the index range could be fifty (50), or the index range could be the number of states currently stored within the measure. In one embodiment, decision operation 840 determines if the index range of the level is constant. In other words, if the minimum value and maximum value are equal then the index range is constant. If the index range is constant for the measure then no space is required to store the measure field. For example, if every value within a measure were 10 then the measure data would be constant. Therefore, since the index range for this measure is constant, operation 840 stores the value 10 within a header and no bits are stored for that measure, saving additional space. In another embodiment of the invention, decision operation 840 is not utilized. Next, decision operation 860 determines if there are any more measures within the cell that may be compressed, and if so, operation flow returns to access operation 820. Otherwise, the operation flow ends.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. For example, those of ordinary skill within the art will appreciate that while the systems, methods, and articles have been described in the context of a multidimensional database system, the systems, methods, and articles of the invention can be applied to other data that is hierarchical in nature. The terminology used in this application with respect creating and maintaining cell records is meant to include all of these environments. Therefore, it is manifestly intended that this invention be limited only by the following claims and equivalents thereof.

I claim:

1. A method for compressing a measure data of a cell record for a database, the method comprising:

accessing the measure data;

determining if the measure data may be compressed, and if so:

determining a size of a space to store the measure data in a compressed format;

storing a value in a header according to the determined size of the space;

compressing the measure data in accordance with the stored value to create a compressed measure data; and storing the compressed measure data in a data store.

2. The method of claim 1, wherein accessing the measure data, comprises accessing the measure data in segments.

3. The method of claim 2, wherein determining the size of the space to store the measure data; comprises:
   determining a minimum value and a maximum value for the measure data; and
   determining the size of the space based on the minimum and maximum value.

4. The method of claim 3, wherein determining the size of the space based on the minimum and maximum value, comprises:
   setting the size of the space to zero if the minimum value equals the maximum value; and
   setting the size of the space based on the maximum value if the minimum value is not equal to the maximum value.

5. The method of claim 4, wherein setting the size of the space based on the maximum value if the minimum value is not equal to the maximum value, comprises;
   setting the size of the space to the number of bits used to represent the maximum value in binary format.

6. The method of claim 5, wherein compressing the measure data in accordance with the determined size to create a compressed measure data, comprises converting the measure data to binary format.

7. A system comprising:
   a processor and a computer-readable medium;
   an operating environment executing on the processor from the computer-readable medium;
   a data store; and
   an OLAP server executing under the control of the operating environment and operative to perform actions, including:
      loading a plurality of cell records from a data store, the cell records having at least one measure data field;
      calculating if each measure data field may be compressed, and if so:
         calculating a compressed size of a space to store each measure data field in a compressed format;
         storing each compressed size of each space in a header;
         compressing each measure data in accordance with each compressed size to create at least one compressed measure data; and
         storing each measure data in a data store.

8. The system of claim 7, wherein calculating the size of the space to store each measure data field; comprises:
   calculating a minimum value and a maximum value for each measure data field; and
   calculating the compressed size of the space based on the minimum and maximum value.

9. The system of claim 8, wherein calculating the compressed size of the space based on the minimum and maximum value, comprises:
   setting the compressed size of the space to zero if the minimum value equals the maximum value; and
   setting the compressed size of the space based on the maximum value if the minimum value is not equal to the maximum value.

10. The system of claim 9, wherein setting the size of the space based on the maximum value if the minimum value is not equal to the maximum value, comprises;
    setting the compressed size of the space to the number of bits used to represent the maximum value in binary format.

11. The system of claim 10, wherein compressing each measure data in accordance with the calculated size to create a compressed measure data, comprises converting each measure data to binary format.

12. A computer-readable medium readable by a computing system and having computer instructions for executing a computer process for compressing a set of measure data, the computer process comprising:
    accessing a segmented set of measure data of a cell record for a database;
    determining if the segmented set of measure data may be compressed;
    determining a size of a space to store the set of measure data in a compressed format;
    storing the size of the space in a header;
    compressing the set of measure data in accordance with each determined size to create a set of compressed measure data; and
    storing the set of measure data in a data store.

13. The computer-readable medium of claim 12, wherein the act of determining the size of the space to store the measure data; comprises:
    determining a minimum value and a maximum value for the set of measure data; and
    determining the size of the space based on the minimum and maximum value.

14. The computer-readable medium of claim 13, wherein the act of determining the size of the space based on the minimum and maximum value, comprises:
    setting the size of the space to zero if the minimum value equals the maximum value; and
    calculating a difference between the minimum value and the maximum value; and
    setting the size of the space based on the difference if the minimum value is not equal to the maximum value.

15. The computer-readable medium of claim 14, wherein the act of setting the size of the space based on the difference if the minimum value is not equal to the maximum value, comprises:
    setting the size of the space to the number of bits used to represent the difference in binary format.

16. The computer-readable medium of claim 15, wherein the act of compressing the set of measure data converts the set of measure data to binary format.

17. Apparatus for compressing a measure data of a cell record in a database, said apparatus comprising:
    a load module loading a plurality of cell records from a data store, the cell records having at least one measure data field;
    a detector calculating if each measure data field may be compressed, and if so:
       size module calculating a calculated size of a space to store each measure data field in a compressed format;
       storage module storing each calculated size of each space in a header;
       compression module compressing each measure data in accordance with each calculated size to create at least one compressed measure data; and
       a data store storing each measure data.

18. The apparatus of claim 17, wherein said size module comprises:
    a min/max module determining a minimum value and a maximum value for each measure data field and calculating the size of the space based on the minimum and maximum value.

19. The system of claim 18, wherein the min/max module, comprises:
a set module setting the size of the space to zero if the minimum value equals the maximum value and setting the size of the space based on the maximum value if the minimum value is not equal to the maximum value.

20. The system of claim 19, wherein said set module setting the size of the space based on the maximum value, if the minimum value is not equal to the maximum value, sets the size of the space to the number of bits used to represent the maximum value in binary format.

21. The system of claim 20, wherein said compression module converts each measure data to binary format.

* * * * *